(12) United States Patent
Shirasaki

(10) Patent No.: US 8,173,330 B2
(45) Date of Patent: May 8, 2012

(54) PELLICLE

(75) Inventor: Toru Shirasaki, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 203 days.

(21) Appl. No.: 12/763,470

(22) Filed: Apr. 20, 2010

(65) Prior Publication Data

US 2010/0273097 A1    Oct. 28, 2010

(30) Foreign Application Priority Data

Apr. 24, 2009   (JP) .................... 2009-106322

(51) Int. Cl.
*G03F 1/14*    (2012.01)

(52) U.S. Cl. ............................................ 430/4; 428/14

(58) Field of Classification Search .................. 430/4, 5; 428/14

See application file for complete search history.

(56) References Cited

U.S. PATENT DOCUMENTS

| 4,861,402 A | 8/1989 | Gordon | |
|---|---|---|---|
| 2006/0127691 A1* | 6/2006 | Chiu et al. | ............. 428/626 |

FOREIGN PATENT DOCUMENTS

| JP | 58-219023 | 12/1983 |
|---|---|---|
| JP | 63-27707 | 6/1988 |
| JP | 7-168345 | 7/1995 |

* cited by examiner

*Primary Examiner* — Stephen Rosasco

(74) *Attorney, Agent, or Firm* — Kratz, Quintos & Hanson, LLP

(57) ABSTRACT

A pellicle is provided that includes an aluminum pellicle frame having an anodized layer on its entire surface; and a pellicle film stretched over and affixed to an end face of the pellicle frame, the anodized layer having a thickness of 4 to 8 μm.

7 Claims, No Drawings

© PELLICLE

BACKGROUND OF THE INVENTION

1. Field of the Invention

The present invention relates to a pellicle. More particularly, the present invention relates to a lithographic pellicle suitably used as a debris shield in the production of a semiconductor device such as an LSI or a ULSI, and to a lithographic pellicle particularly suitably used for UV irradiation of 200 nm or below which is employed in exposures where high resolution is required.

2. Description of the Related Art

Conventionally, in the production of a semiconductor device such as an LSI or a VLSI, or the production of a liquid crystal display panel, a pattern is formed by irradiating a semiconductor wafer or a liquid crystal substrate with light; if debris is attached to the exposure master plate used here, since the debris absorbs the light or reflects the light, there are the problems that the replicated pattern is deformed, or the edge becomes rough, or thus impairing the dimensions, quality, appearance, etc., resulting in the decrease in the performance and the manufacturing yield of semiconductor devices or liquid crystal display panels.

For this reason, these operations are usually carried out in a clean room, but always keeping an exposure master plate clean even within a clean room is difficult, and hence there is employed a method in which a pellicle that allows exposure light to easily pass through is affixed to the surface of the exposure master plate to act as a debris shield.

In this case, the advantage is that the debris does not attach directly to the surface of the exposure master plate but becomes adhered to the pellicle film, so that during lithography, the debris on the pellicle film does not become involved in the replication provided that the focus is set onto the pattern of the exposure master plate.

The pellicle has a constitution in which a transparent pellicle film made of nitrocellulose, cellulose acetate or etc., which allows exposure light to easily pass through, is adhered on the upper part of a pellicle frame made of aluminum, stainless steel, polyethylene or etc., by coating the upper part of the pellicle frame with a good solvent for the pellicle film and then air-drying the solvent (ref. JP-A-58-219023; JP-A denotes a Japanese unexamined patent application publication) or by means of an adhesive such as an acrylic resin, an epoxy resin or etc. (ref. U.S. Pat. No. 4,861,402, JP-B-63-27707 and JP-A-7-168345; JP-B denotes a Japanese examined patent application publication), while on the under part of the pellicle frame is attached a pressure-sensitive adhesive layer comprising a polybutene resin, a polyvinyl acetate resin, an acrylic resin, a silicone resin or etc., and a release layer (separator) for protection of the pressure-sensitive adhesive layer.

In recent years, lithography resolutions have been gradually increasing, and therefore the employed light sources are slowly shifting to shorter wavelengths to realize such resolutions. Specifically, there is a shift towards g-line (436 nm), i-line (365 nm), and KrF excimer lasers (248 nm) in ultraviolet light, while ArF excimer lasers (193 nm) have begun to be used recently.

BRIEF SUMMARY OF THE INVENTION

It is an object of the present invention to provide a pellicle which releases little amount of acid and ammonium ion, and exhibits excellent detectability with a pellicle detection sensor.

The above-mentioned object of the present invention has been attained by means (1) below, which is described together with preferred embodiments (2) and (3).

(1) A pellicle comprising: an aluminum pellicle frame having an anodized layer (hereinafter also called an 'alumite layer') on its entire surface; and a pellicle film stretched over and affixed to an end face of the pellicle frame, the anodized layer having a thickness of 4 to 8 µm, (2) the pellicle according to (1), wherein the alumite layer is an alumite layer comprising a black dye, (3) the pellicle according to (1) or (2), wherein it is intended for use in lithography employing exposure with UV light of 200 nm or below.

DETAILED DESCRIPTION OF THE INVENTION

The pellicle of the present invention comprises an aluminum pellicle frame having an anodized layer (an alumite layer) on its entire surface; and a pellicle film stretched over and affixed to an end face of the pellicle frame, the anodized layer having a thickness of 4 to 8 µm.

The alumite layer is preferably an alumite layer comprising a black dye.

Furthermore, the pellicle of the present invention is suitably used for a pellicle for lithography.

The present invention is explained in detail below.

Long term use of a photomask (hereinafter, also called simply a "mask") may cause the deposition of foreign matter on the surface of the mask. This is due to the reaction of gaseous components present in the air to form solid matter on the photomask surface, which grow to the growing foreign matter (haze) that can be printed. Furthermore remaining ions or organic components on the mask may also react to grow to the foreign matter. Particularly in the case of exposure using light with a short wavelength such as KrF or ArF, since there are many materials that absorb short-wavelength light, these materials may make a transition to the excited state by absorbing the light during exposure, and thereby, generation of foreign matters may be accelerated. Therefore, under the environment of the semiconductor exposure process, the generation of the growing foreign matter is suppressed by controlling the concentration of ions or organic components in the air.

Furthermore, particularly in the case of exposure using ArF, ammonium sulfate is often generated as the growing foreign matter. On the other hand, in the process of the mask production, sulfuric acid or ammonia has generally been used in the mask cleaning step. If these chemicals remain on the surface of the mask, growing foreign matter may be generated from the residues. Therefore, there is a move to limit the use of hydrogen sulfuric acid or ammonia in the mask cleaning step, and instead, for example, cleaning with ozone water has begun to be used.

Meanwhile, with regard to the pellicle, a pellicle frame generally comprises aluminum alloy, and the surface of the aluminum frame is generally subjected to a black anodized treatment (hereinafter also called a 'black alumite treatment'). But since sulfuric acid is generally used in the alumite treatment, sulfuric acid is detected from such a pellicle frame. Furthermore, even when an acid other than sulfuric acid is used in the alumite treatment, the substitute acid may remain in the alumite layer. Thus, in the case of the frame with the alumite treatment, an acid such as sulfuric acid may remain in the alumite layer, and the remaining acid component may become the cause of the growing foreign matter on the mask when the pellicle is affixed to the mask.

Furthermore, an azo dye is generally used as a black dye in black alumite treatment. An ammonia ion (ammonium ion) can be detected from the azo dye as an impurity. It is highly possible that the ammonia ion will become the cause of ammonium sulfate, which is the typical growing foreign matter. The sulfate ion and ammonia ion are detected by means of ion analysis in the pellicle frame which has undergone a black alumite process. This will pose a problem when the generation of the growing foreign matter of the ammonium sulfate is required to be restrained.

A pellicle frame coated with black resin or etc. may be used instead of alumite treatment for the purpose of reducing such ions, however, there are disadvantages such that the black resin coating is generally expensive and is susceptible to light degradation, and therefore there exists a need to restrain the ions while using the black alumite frame.

Furthermore, as the remaining ions in the alumite layer are generally trapped therein, most of the ions on the surface may be washed away by cleaning the pellicle frame with ultra pure water. However, heating the pellicle frame during the process of production may cause the alumite layer to crack, and the ions inside the alumite layer may come out to the surface.

The present inventors have found that, in the case that ions in the alumite layer come to the surface due to cracking, the amount of ions coming to the surface can be reduced by making the alumite layer thinner because, thereby, the amount of ions contained inside the alumite layer decreases.

It is advantageous to make the alumite layer as thin as possible in order to reduce the amount of ions, but, on the other hand, the surface of the frame with the thinner alumite layer lose blackness, resulting in the color of the frame shifting from black to grey or brown. When the pellicle is used being affixed to the mask, sensor light may hit the frame to detect the presence or absence of the pellicle. Therefore, the large color deviation from black of the pellicle frame may make detection of the pellicle impossible. Consequently, the alumite layer is required to have a certain thickness and retain a certain degree of blackness.

The pellicle frame used in the pellicle of the present invention is an aluminum pellicle frame with an alumite layer on its entire surface; and a pellicle film stretched over and affixed to an end face of the pellicle frame, the anodized layer having a thickness of 4 to 8 μm.

The pellicle is made of aluminum. The term "aluminum" as used here includes not only pure aluminum but also an aluminum alloy.

Examples of the aluminum used for the pellicle frame include, not particularly limited to, pure aluminum and an aluminum alloy such as JIS A7075, JIS A6061, JIS A5052 material.

Dimensions of the pellicle frame may be, not particularly limited, appropriately selected as necessary. For example, the dimensions can be similar to those of a pellicle for semiconductor lithography and a pellicle for a lithography process of producing a large liquid crystal display panel.

The pellicle frame used in the present invention has an alumite, layer on the surface thereof.

The alumite layer is preferably an alumite layer containing a black dye (hereinafter, also called simply a "black alumite layer").

Examples of the black dye that can be used include, not particularly limited to, any known dyes, but preferably an organic dye and more preferably an azo dye.

Examples of the azo dye that can be used include Deep Black (product name, manufactured by Clariant).

The thickness of the alumite layer is 4 to 8 μm. In the above-mentioned range, the pellicle releases very little amount of acid and ammonium ion, and exhibits excellent detectability by a pellicle detection sensor. Furthermore, most of the acid released from the pellicle comes from the acid used in the formation of the alumite layer, and most of the ammonium ion released from pellicle comes, as previously mentioned, from the black dye.

Furthermore, since thickness of the alumite layer is as thin as 4 to 8 μm, preferably the alumite layer is not only black, but also dark gray or grayish brown in color.

The method for forming the alumite layer containing a black dye on the pellicle is not particularly limited, and any known method can be used.

Specifically, examples of the method includes a method for forming an alumite layer on the surface in which the pellicle frame is processed in an alkaline (e.g., NaOH) processing bath, anodized in a dilute sulfuric solution, subsequently dyed with a black dye and then sealed.

The anodization may form a desired alumite layer by appropriately adjusting the acid concentration, the current density, the electrolyte temperature and the current-carrying time, preferably, for example, in a concentration of 10 to 20% sulfuric acid, with a current density of 1 to 2 A/dm$^2$, at an electrolyte temperature of 15 to 30° C., and with a current-carrying time of 10 to 30 min. In this case, a multitude of micropores (50 to 200 Å in diameter, 500 to 1,500 Å in pitch) are formed orderly on the surface of the alloy. Subsequently, black treatment can be performed using these pores.

Furthermore, besides the sulfuric acid mentioned above, examples of the acid used in the anodization include nitric acid and organic acids (e.g., oxalic acid, formic acid, and acetic acid).

Examples of the method for the black treatment include a method in which the pellicle frame is immersed in a solution of a black-dye to adsorb the dye in the pores. With regard to dyeing condition, for example, the concentration of the dye of 3 to 10 g/l and the solution temperature of 50 to 65° C. are preferable.

Subsequently, it is preferable to carry out sealing treatment to seal the pores. It is preferable to use boiled water added with 6 to 10 g/l of a pore-sealing additive for this treatment. The fine pores are filled thereby allowing the alumite layer to become dense. The pore-sealing additive is not particularly limited, but any known pore-sealing additive such as nickel acetate may be used.

The surface of the pellicle frame of the invention may be roughened by sandblasting or chemical abrasion prior to providing an alumite layer. In the present invention, a method for roughening the surface of the frame may employ a conventionally known method. It is preferable to employ a method for roughening the surface involving blasting the aluminum alloy material surface with stainless steel, carborundum, glass beads, etc., followed by further chemically abrading with NaOH, etc.

The pellicle of the present invention comprises a pellicle film stretched over the pellicle frame.

The material of pellicle film is not particularly limited and, for example, an amorphous fluorine polymer that has been conventionally used for an excimer laser is suitably used.

Examples of the amorphous fluorine polymer include Cytop (product name, manufactured by Asahi Glass Co. Ltd.) and Teflon (Registered Trademark) AF (product name, manufactured by DuPont). These polymers may be used by being dissolved in a solvent as necessary when preparing the pellicle film, and may be dissolved as appropriate in, for example, a fluorine-based solvent.

The method of stretching a pellicle over the pellicle frame is not particularly limited, and any known method can be used.

The adhesive for adhering a pellicle film can employ a conventionally used adhesive; examples thereof include an acrylic resin adhesive, an epoxy resin adhesive, a silicone resin adhesive, and a fluorine-based polymer such as a fluorine-containing silicone adhesive, and among them a fluorine-based polymer is suitable. Specific examples of the fluorine-based polymer include the fluorine-based polymer CT-69 (product name, manufactured by Asahi Glass Co. Ltd.).

The pellicle of the present invention comprises a pressure-sensitive adhesive on the end face of the pellicle frame for affixing the pellicle to the mask.

As a pressure-sensitive adhesive, double-sided pressure-sensitive tape, a silicone resin pressure-sensitive adhesive, an acrylic pressure-sensitive adhesive, etc. can be cited.

The pellicle of the present invention may be produced by a conventional method in which a pellicle film is stretched over an upper end face of a pellicle frame via a pressure-sensitive adhesive layer, and normally an adhesive layer is formed on a lower end face of the pellicle frame, and a release layer is detachably affixed to a lower end face of the adhesive layer. Here, the pressure-sensitive adhesive layer for affixing the pellicle film formed on the upper end face of the pellicle frame can be formed by applying an pressure-sensitive adhesive to the upper end face of the pellicle frame after being diluted with a solvent as necessary, followed by heat drying and curing. In this case, examples of the method adopted for applying the adhesive include the methods of brushing, spraying, and an auto dispenser.

Furthermore, the pellicle of the present invention may comprise a release layer for protection of the pressure-sensitive adhesive layer. Examples of the release layer for protection include a separator.

The release layer for protection is not particularly limited in terms of material. Examples thereof include polyethylene terephthalate, polytetrafluoroethylene, fluorocarbon polymers, polyethylene, polycarbonate, polyvinyl chloride, and polypropylene.

According to the present invention, there is provided a pellicle which releases little amount of acid and ammonium ion, and exhibits excellent detectability with a pellicle detection sensor.

EXAMPLES

The present invention is explained below more specifically by reference to Examples.

Example 1

An aluminum pellicle frame having outer dimensions of 149 mm×122 mm×5.8 mm and a frame thickness of 2 mm was prepared. An 8 μm thick black alumite layer was formed on the surface of the frame, thus completing the pellicle frame.

Formation of the black alumite layer was carried out by anodizing with sulfuric acid using Deep Black MLW (product name, manufactured by Clariant) as a black dye.

A 5% solution of Cytop CTX-S (Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature (25° C.) for 30 minutes and then at 180° C., thus giving a uniform film. An aluminum frame support coated with an adhesive was affixed thereto, and only the film was peeled off, thus giving a pellicle film.

One end face of the pellicle frame was coated with a mask pressure-sensitive adhesive (silicone resin X-40-3122, Shin-Etsu Chemical Co., Ltd.), and the other end face was coated with a film adhesive (CT-69, Asahi Glass Co., Ltd.). Subsequently, the pellicle film taken onto the aluminum frame was affixed to the film adhesive side, and the film on the outer periphery of the frame was cut, thus completing the pellicle. The color of the frame was black. There were no problems in detection by a pellicle detection sensor. The pellicle detection sensor employed a fiber sensor manufactured by Keyence Corporation.

The pellicle thus completed was placed in a polypropylene bag, and 100 mL of pure water was poured thereinto so that the pellicle was fully immersed. The bag was heat-sealed, and subsequently heated at 80° C. for 1 hour. When the extraction water was analyzed using a DIONEX-500 ion chromatogram (Dionex Corporation), 0.05 ppm of sulfate ion and 0.05 ppm of ammonium ion were detected.

Example 2

An aluminum pellicle frame having outer dimensions of 149 mm×122 mm×5.8 mm and a frame thickness of 2 mm was prepared. A 6 μm thick black alumite layer was formed on the surface of the frame, thus completing the pellicle frame.

Formation of the alumite layer was carried out in the same manner as in Example 1 except that the thickness of the alumite layer was 6 μm.

A 5% solution of Cytop CTX-S (Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature for 30 minutes and then at 180° C., thus giving a uniform film. An aluminum frame support coated with an adhesive was affixed thereto, and only the film was peeled off, thus giving a pellicle film.

One end face of the pellicle frame was coated with the mask pressure-sensitive adhesive in the same manner as Example 1, and the other end face was coated with a film adhesive. Subsequently, the pellicle film taken onto the aluminum frame was affixed to the film adhesive side, and the film on the outer periphery of the frame was cut, thus completing the pellicle. The color of the frame in this case was dark gray. There were no problems in detection of the formed pellicle carried out by the pellicle detection sensor in the same manner as Example 1.

The pellicle thus completed was placed in a polypropylene bag, and 100 mL of pure water was poured thereinto so that the pellicle was fully immersed. The bag was heat-sealed, and subsequently heated at 80° C. for 1 hour. When the extraction water was analyzed using the ion chromatogram used in Example 1 in the same manner as in Example 1, 0.03 ppm of sulfate ion and 0.03 ppm of ammonium ion were detected.

Example 3

An aluminum pellicle frame having outer dimensions of 149 mm×122 mm×5.8 mm and a frame thickness of 2 mm was prepared. A 4 μm thick black alumite layer was formed on the surface of the frame, thus completing the pellicle frame.

Formation of the alumite layer was carried out in the same manner as in Example 1 except that the thickness of the alumite layer was 4 μm.

A 5% solution of Cytop CTX-S (Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature for 30 minutes and then at 180° C., thus giving a uniform film. An aluminum frame support coated with an adhesive was affixed thereto, and only the film was peeled off, thus giving a pellicle film.

One end face of the pellicle frame was coated with the mask pressure-sensitive adhesive in the same manner as Example 1, and the other end face was coated with a film adhesive. Subsequently, the pellicle film taken onto the aluminum frame was affixed to the film adhesive side, and the film on the outer periphery of the frame was cut, thus completing the pellicle. The color of the frame was grayish brown. There were no problems in detection of the formed pellicle carried out by the pellicle detection sensor in the same manner as Example 1.

The pellicle thus completed was placed in a polypropylene bag, and 100 mL of pure water was poured thereinto so that the pellicle was fully immersed. The bag was heat-sealed, and subsequently heated at 80° C. for 1 hour. When the extraction water was analyzed using the ion chromatogram used in Example 1 in the same manner as in Example 1, 0.02 ppm of sulfate ion and 0.02 ppm of ammonium ion were detected.

Comparative Example 1

An aluminum pellicle frame having outer dimensions of 149 mm×122 mm×5.8 mm and a frame thickness of 2 mm was prepared. A 10 μm thick black alumite layer was formed on the surface of the frame, thus completing the pellicle frame.

Formation of the alumite layer was carried out in the same manner as in Example 1 except that the thickness of the alumite layer was 10 μm.

A 5% solution of Cytop CTX-S (Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature for 30 minutes and then at 180° C., thus giving a uniform film. An aluminum frame support coated with an adhesive was affixed thereto, and only the film was peeled off, thus giving a pellicle film.

One end face of the pellicle frame was coated with the mask pressure-sensitive adhesive in the same manner as Example 1, and the other end face was coated with a film adhesive. Subsequently, the pellicle film taken onto the aluminum frame was affixed to the film adhesive side, and the film on the outer periphery of the frame was cut, thus completing the pellicle. The color of the frame in this case was black. There were no problems in detection of the formed pellicle carried out by the pellicle detection sensor in the same manner as Example 1.

The pellicle thus completed was placed in a polypropylene bag, and 100 mL of pure water was poured thereinto so that the pellicle was fully immersed. The bag was heat-sealed, and subsequently heated at 80° C. for 1 hour. When the extraction water was analyzed using the ion chromatogram used in Example 1 in the same manner as in Example 1, 0.15 ppm of sulfate ion and 0.15 ppm of ammonium ion were detected.

Comparative Example 2

An aluminum pellicle frame having outer dimensions of 149 mm×122 mm×5.8 mm and a frame thickness of 2 mm was prepared. A 2 μm thick black alumite layer was formed on the surface of the frame, thus completing the pellicle frame.

Formation of the alumite layer was carried out in the same manner as in Example 1 except that the thickness of the alumite layer was 2 μm.

A 5% solution of Cytop CTX-S (Asahi Glass Co., Ltd.) dissolved in perfluorotributylamine was dropped on a silicon wafer and spread over the wafer by rotating the wafer at 830 rpm by a spin coating method. Subsequently, drying was carried out at room temperature for 30 minutes and then at 180° C., thus giving a uniform film. An aluminum frame support coated with an adhesive was affixed thereto, and only the film was peeled off, thus giving a pellicle film.

One end face of the pellicle frame was coated with the mask pressure-sensitive adhesive in the same manner as Example 1, and the other end face was coated with a film adhesive. Subsequently, the pellicle film taken onto the aluminum frame was affixed to the film adhesive side, and the film on the outer periphery of the frame was cut, thus completing the pellicle. The color of the frame in this case was brown. The pellicle could not be detected by the pellicle detection sensor when the detection process was carried out in the same manner as Example 1.

The pellicle thus completed was placed in a polypropylene bag, and 100 mL of pure water was poured thereinto so that the pellicle was fully immersed. The bag was heat-sealed, and subsequently heated at 80° C. for 1 hour. When the extraction water was analyzed using the ion chromatogram used in Example 1 in the same manner as in Example 1, 0.01 ppm of sulfate ion and 0.01 ppm of ammonium ion were detected.

TABLE 1

| | Thickness of anodized layer | Sulfate ion | Ammonium ion | Color tone | Detection sensor |
| --- | --- | --- | --- | --- | --- |
| Ex. 1 | 8 μm | 0.05 ppm | 0.05 ppm | black | detectable |
| Ex. 2 | 6 μm | 0.03 ppm | 0.03 ppm | dark gray | detectable |
| Ex. 3 | 4 μm | 0.02 ppm | 0.02 ppm | grayish brown | detectable |
| Comp. Ex. 1 | 10 μm | 0.15 ppm | 0.15 ppm | black | detectable |
| Comp. Ex. 2 | 2 μm | 0.01 ppm | 0.01 ppm | brown | undetectable |

What is claimed is:

1. A pellicle comprising: an aluminum pellicle frame having an anodized layer on its entire surface; and a pellicle film stretched over and affixed to an end face of the pellicle frame, the anodized layer having a thickness of 4 to 8 µm.

2. The pellicle according to claim 1, wherein the anodized layer is an anodized layer comprising a black dye.

3. The pellicle according to claim 2, wherein the black dye is an azo dye.

4. The pellicle according to claim 1, wherein the anodized layer is an alumite layer with a dark gray color to a grayish brown color.

5. The pellicle according to claim 1, wherein the thickness of the anodized layer is 4 to 6 µm.

6. The pellicle according to claim 1, wherein the anodized layer is an anodized alumite layer.

7. The pellicle according to claim 1, wherein it is intended for use in lithography employing exposure with UV light of 200 nm or below.

* * * * *